United States Patent [19]

Sedigh et al.

[11] Patent Number: 5,151,846

[45] Date of Patent: Sep. 29, 1992

[54] SURFACE MOUNTABLE RECTIFIER AND METHOD FOR FABRICATING SAME

[75] Inventors: Mohammad Sedigh, Merrick; Richard Shyr; Edward Shih, both of Greenlawn; Muni Mitchell, Holbrook, all of N.Y.

[73] Assignee: General Instrument Corp., Hatboro, Pa.

[21] Appl. No.: 748,876

[22] Filed: Aug. 23, 1991

[51] Int. Cl.⁵ .................... H01G 9/16; H01G 1/14; H01L 23/02
[52] U.S. Cl. .................... 361/306; 361/436; 357/74
[58] Field of Search ............ 29/25.03, 25.42; 361/306, 400, 436, 402-405, 535-540; 338/226; 357/74, 72, 73

[56] References Cited

U.S. PATENT DOCUMENTS

| | | | |
|---|---|---|---|
| 3,612,963 | 10/1971 | Piper et al. | 29/25.42 |
| 4,176,445 | 12/1979 | Solov | 29/620 |
| 4,430,664 | 2/1984 | Matsunnaga et al. | 357/73 |
| 4,564,885 | 1/1986 | McCann | 361/436 |
| 4,672,358 | 6/1987 | Pryst et al. | 338/226 |
| 4,814,947 | 3/1989 | Gunter | 361/540 |
| 4,942,139 | 7/1990 | Pawlowski | 437/209 |
| 5,008,735 | 4/1991 | Edmond et al. | 357/74 |

*Primary Examiner*—Donald Griffin
*Attorney, Agent, or Firm*—James & Franklin

[57] ABSTRACT

The rectifier sub-assembly, formed by high temperature brazing, is glass encapsulated. It has axially extending leads with enlarged head portions. The sub-assembly is prepared for surface mounting by first flattening the leads outwardly from the enlarged head portions. An electrically insulating, heat conductive epoxy body is molded around the capsule, the enlarged head portions and at least a portion of each of the flattened lead sections. The leads are trimmed and if required, bent into the appropriate shape. After forming, the leads are barrel plated to obtain the best solderable surface for the most reliable electrical connection.

13 Claims, 5 Drawing Sheets

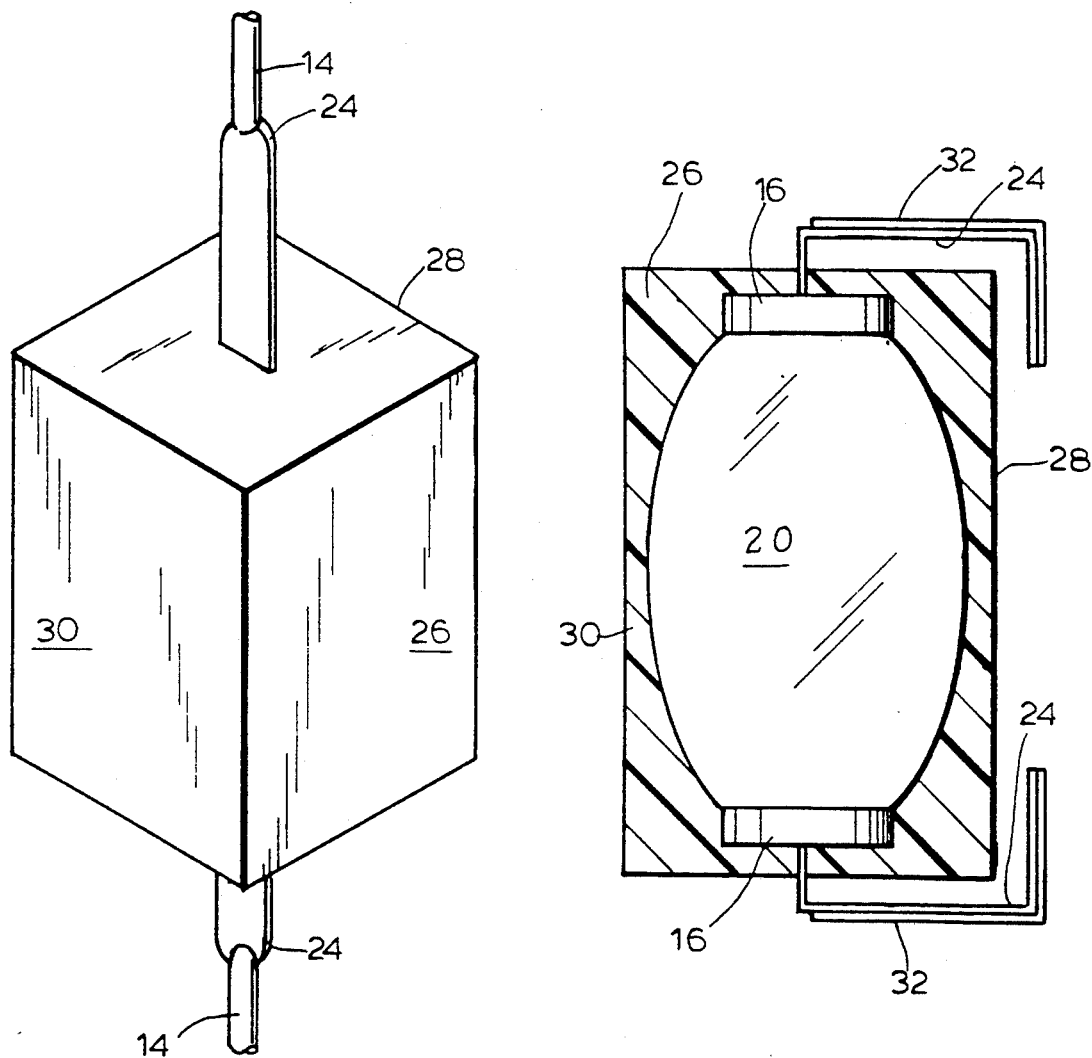

SURFACE MOUNTABLE RECTIFIER AND METHOD FOR FABRICATING SAME

The present invention relates to glass encapsulated rectifiers and more particularly to a surface mountable rectifier and a method for fabricating a glass encapsulated diode rectifier sub-assembly adapted for surface mounting.

Glass encapsulated semiconductor rectifiers, with axially extending leads of round cross-sectional configuration, are discrete components well known in the art. These rectifiers consist of a diode in the form of a semiconductor chip with substantially planar opposing surfaces. Electrode slugs of molybdenum are affixed to the opposite surfaces of the diode. Thereafter, conductive leads, having enlarged portions at their ends, are joined to the non-attached surfaces of the slugs, so that they extend co-axially from the subassembly.

The present invention preferably utilizes a subassembly structure similar to that described, except that it employs special high temperature brazing materials to bond the components. The components may be assembled in a fixture, such as a graphite boat, with high temperature brazing preforms suitably positioned. The boat is heated to around 700°–800° C. for about 5–10 minutes, and thereafter cooled to room temperature.

The high temperature brazed components are then encapsulated through the use of a glass slurry which is heated in a furnace to about 600°–700° C. for 5–10 minutes and thereafter cooled. The glass capsule encloses the diode and electrodes but the leads, including the enlarged head portions, remain exposed. As a result of the encapsulation process, the chip is hermetically sealed in a glass capsule with the axial leads extending from the ends of the capsule. If it is not to be adapted for surface mounting, the glass encapsulated chip is then prepared as an axial leaded component.

However, according to the present invention, the high temperature brazed glass encapsulated rectifier may be adapted for surface mounting on a printed circuit board or the like, as is common today with other types of components, such as integrated circuits. In general, the method of fabrication involves flattening the axially extended leads adjacent the enlarged head portions and thereafter molding an electrically insulating, heat conductive epoxy body around the capsule so as to surround the enlarged head portions and the adjacent flattened lead portions. The body has a planar surface which is substantially parallel to the flattened lead portions and preferably has a three dimensional rectangular configuration. The leads are trimmed and bent into the desired configuration and thereafter barrel plated to provide the most uniform solderable surface to insure a reliable electrical connection.

U.S. Pat. No. 4,672,358 issued June 9, 1987 to Pryst et. al. and entitled "Surface Mounted Power Resistors" teaches a method whereby a power resistor, a component which generates relatively large amount of heat, can be adapted for automated surface mounting through the use of a molded epoxy body. While that patent purports to teach a structure usable with all axial lead components, including diodes, its teachings are not directly applicable to glass encapsulated high temperature brazed diode rectifiers which are formed from subassemblies, including leads with enlarged heads brazed to electrodes which sandwich the diode and in which at least a portion of the enlarged lead head portions are exposed. The power resistors disclosed by Pryst have axial leads which extend directly from resistive material. No metallic enlarged head portions are present or exposed.

Moreover, Pryst does not plate the leads, much less teach plating the leads after forming them to insure the best solderable surface. Although Pryst does not discuss plating of the leads at all, if the leads are plated on a surface mountable component it is conventional to plate prior to trimming and bending. Rack plating or reel plating processes are commonly used. However, plating before the leads are formed into their final configuration does not result in the best surface for soldering. The most reliable electrical connection may therefore not be obtained when the device is surface mounted.

Plating the flattened leads prior to trimming and bending the leads forms a solderable surface on the leads, but this surface is subject to disruption as the configuration of the leads is altered by further processing. The surface disruption is a result of the impact of the stamping process employed for trimming and/or even more likely, of the bending of the leads to form corners. Moreover, surface disruption caused in this way is often located at the most critical area of the leads exactly, where connection to the PC board is made.

The present invention overcomes this problem by plating the leads only after trimming and bending operations are complete. This insures that the best, most uniformed solderable surface is obtained. A barrel plating process preferably employed. In this way, no impact on bending forces are applied to the lead after plating and the solderable surface is much less likely to be disrupted. The result is a more reliable electrical connection.

It is, therefore, a prime object of the present invention to provide a structure and a fabrication method for making a high temperature brazed glass encapsulated diode rectifier subassembly suitable for surface mounting on a printed circuit board or the like.

It is another object of the present invention to provide a surface mountable rectifier and a method for fabricating same which results in leads which make reliable electrical connections.

It is another object of the present invention to provide a surface mountable rectifier and a method for fabricating same in which leads are plated after trimming and bending to insure the best solderable surface.

It is another object of the present invention to provide a surface mountable rectifier and a method for fabricating same which employs the same components and materials currently used for making high temperature brazed axial leaded encapsulated rectifiers such that the invention can be practiced on a continuation of the manufacturing line used to produce the subassemblies.

It is another object of the present invention to provide a surface mountable rectifier and method for fabricating same which is suitable for use for a military market because the rectifier is hermetically sealed with glass prior to molding in epoxy.

In accordance with one aspect of the present invention, a semiconductor rectifier is provided comprising a subassembly comprising a diode electrically connected between electrodes and conductive leads including enlarged head portions adjacent the electrodes and elongated portions extending outwardly in opposite directions. The sub-assembly is encapsulated in glass with the enlarged head portions exposed and the elongated lead portions extending substantially axially. Each of the elongated lead portions has substantially co-planar flattened section adjacent the head portion from which it extends. An electrically insulating, heat conductive body surrounds the capsule, the exposed enlarged head portions and at least a portion of each of the flattened elongated lead sections. The exposed flattened lead portions have a bent section with a solderable surface coating.

The electrodes comprises molybdenum slugs. The enlarged head portions of the leads are bonded to the exterior surfaces of the slugs.

In accordance with another aspect of the present invention, a method for fabricating a sealed semiconductor rectifier is provided including.

First, a sub-assembly is formed by placing a diode between electrodes which are in turn situated between the enlarged head portions of the leads and then bonding the components together. The elongated portions of the leads extend axially in opposite directions. The subassembly is glass encapsulated leaving the enlarged head portions at least partially exposed. Sections of the elongated lead sections are flattened. The encapsulated subassembly and at least a portion of each flattened lead section is enclosed by an electrically insulating, heat conductive body. The flattened head sections are then shaped and plated to form a solderable surface.

The step enclosing the encapsulated subassembly includes the step of molding an epoxy body around the capsule. The step of shaping the leads comprises the step of trimming the exposed leads. The step of shaping the leads further comprises the step of bending the exposed leads. The step of plating the flattened leads comprises the step of barrel plating.

To these and such other objects which may hereinafter appear, the present invention relates to a surface mountable rectifier and method for fabricating same, as set forth in detail in the following specification and recited in the annexed claims, taken together with the accompanying drawings in which like numerals refer to like parts and in which:

FIG. 3 is a side plan view of the device after encapsulation;

FIG. 8 is an isometric view of the device as it appears in FIG. 7; and

FIG. 9 is an enlarged partial cross sectional view of the above with leads trimmed, bent and plated.

Figure 1:
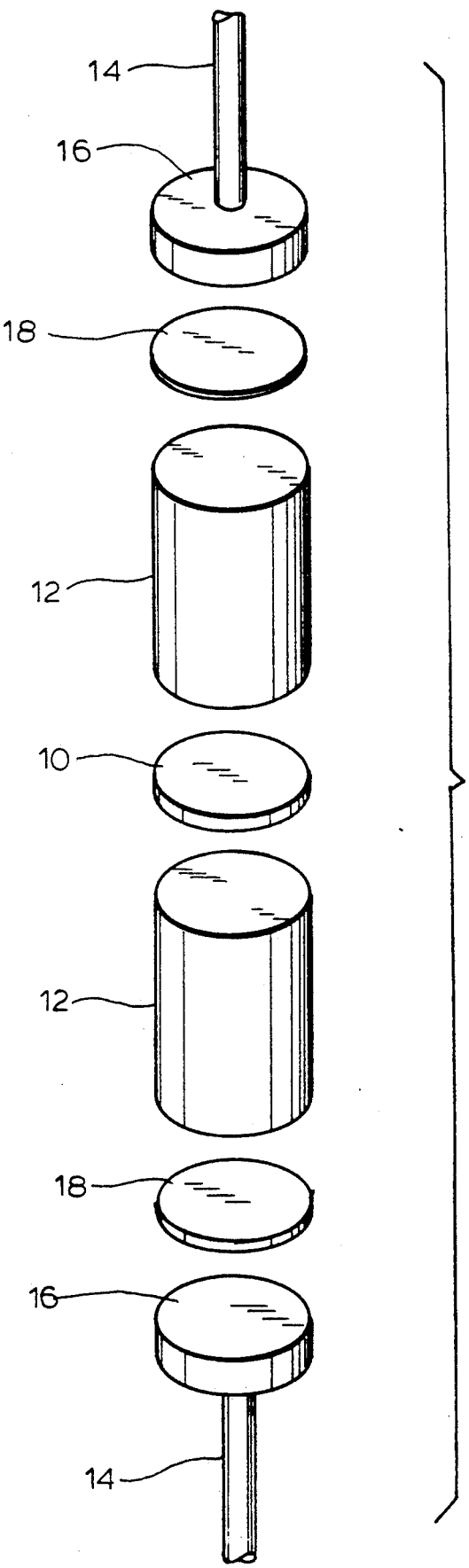
FIG. 1 is an exploded isometric view of the parts of the device prior to brazing.

As shown in the drawings, the rectifier includes a diode 10 in the form of a semiconductor chip with substantially planar opposing surfaces. Affixed to each of the diode surfaces is an electrode in the form of a cylindrical molybdenum slug 12. Electrodes 14, having enlarged head portions 16, are affixed to the other ends of slugs 12 through the use of a high temperature brazing material in the form of a disc or preform 18.

Figure 2:
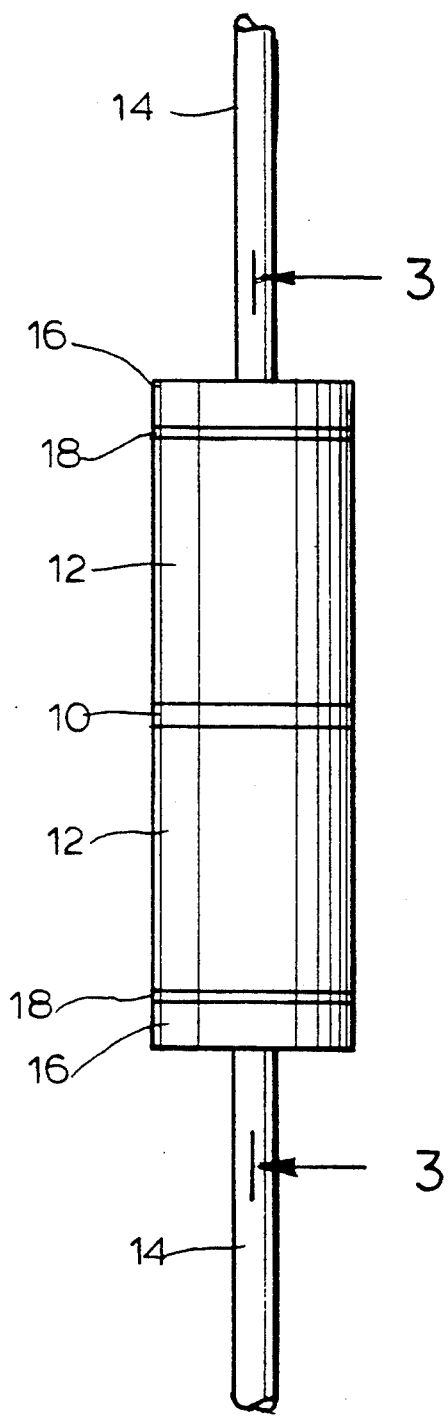
FIG. 2 is a side plane view of the parts of the device after brazing.
Figure 3:
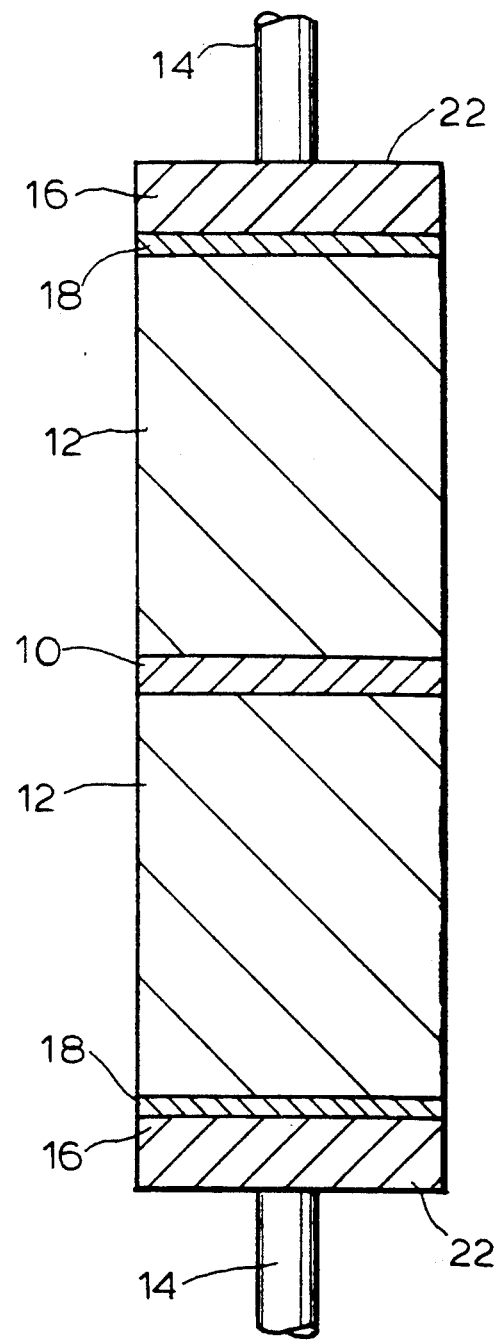
FIG. 3 is an enlarged cross sectional view similar to FIG. 2.
Figure 4:
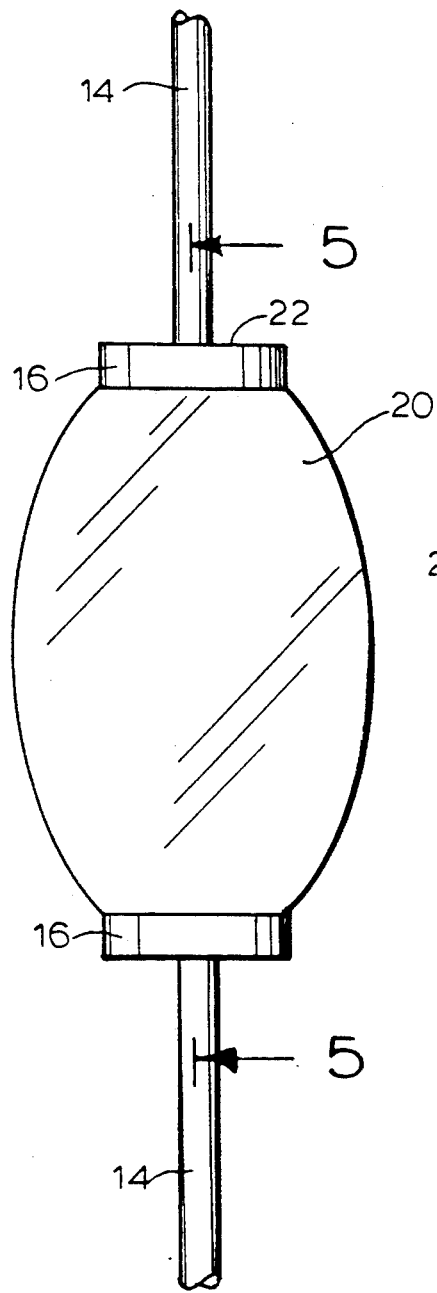
Figure 5:
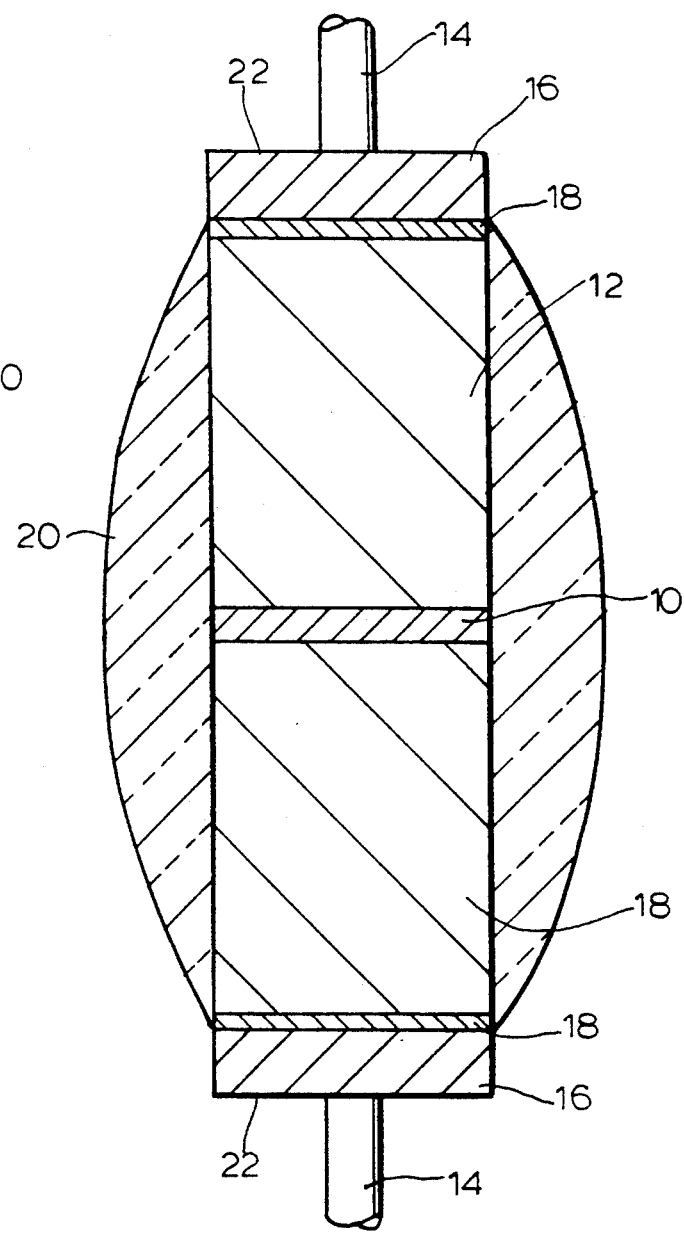
FIG. 5 is an enlarged cross sectional view of the device as it appears on FIG. 4.

The leads 14, brazing preforms 18, slugs 12 and semiconductor diode 10 form a subassembly which is loaded into a fixture, such as a graphite boat, and heated to approximately 700°-800° C. for about 5-10 minutes to join the components. The subassembly is then cooled to room temperature and appears as shown in FIGS. 2 and 3. Glass encapsulation is then performed. This step can be done by applying a glass slurry around the subassembly for chip passivation. After applying the glass slurry, the assembly is heated in a furnace to about 600°-700° C. for 5-10 minutes and then allowed to cool to room temperature. The result of encapsulation is to form a chip which is hermetically sealed within a solid glass capsule 20 such as seen in FIGS. 4 and 5. It should be noted that capsule 20 is open ended, exposing the enlarged head portions 16 of leads 14.

The subassembly is described morefully in co-pending Application Ser. No. 447,213 filed Dec. 7, 1989 in the names of Roman Hamerski, John A. Edmone, Douglas G. Waltz, Muni M. Mitchell and Mohammad Sedigh and entitled "Package Diode for High Temperature Operation". The brazing material is described in detail in co-pending application Ser. No. 594,014 filed Oct. 9, 1990 in the names of Roman Hamerski and John Moroney, entitled "High Temperature Brazing Material with Diffusion Barrier".

Figures 6, 7:
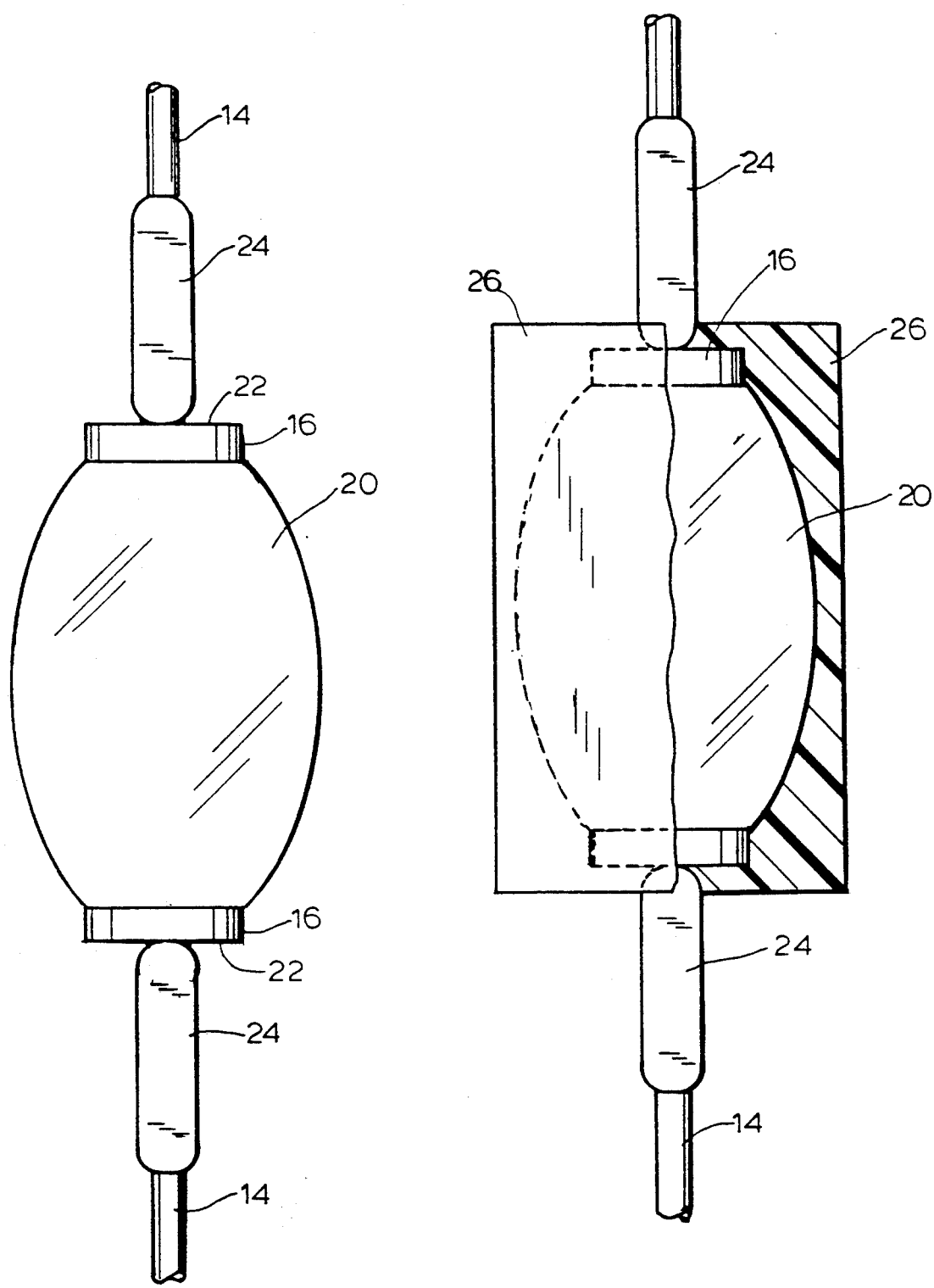
FIG. 6 is a side plan view of the encapsulated device with the leads flattened.
FIG. 7 is a partial cross sectional view of the device after the epoxy body has been formed.

The encapsulated subassembly is transferred to a lead flattening station. There, the leads are flattened from a point proximate the outer surface 22 of the enlarged head portions 16 outwardly, for a given length. The length of the flattened section 24 is determined by the final configuration of the leads, that is gull wing or "c" bend. The assembly now appears as shown in FIG. 6.

After the lead flattening step, the assembly is placed inside a mold cavity. Liquid epoxy is introduced into the cavity, such that it covers the glass capsule, enlarged lead head portions 16 and at least a portion of each of the flattened lead sections 24. The epoxy is then cured so as to form a solid, hard body 26 having at least one planar surface 28. In the preferred embodiment, body 28 takes the form of a three dimensional rectangle having opposing planar surfaces 28 and 30 which are in planes parallel to the plane of the flattened lead sections 24. The epoxy of which body 28 is formed is electrically insulative and heat conductive.

After formation of body 28, the surfaces of the flattened lead portions 24 are shaped. Specifically, the leads are trimmed to the appropriate length by stamping or other suitable process and then appropriately bent to form either a gull wing or "c" bend shape. Thereafter, solderable surface 32 of the tin or tin/lead alloy is formed on the leads.

Surface 32 is preferably formed by plating the unit in a revolving barrel after the leads are shaped. In this way, the leads are not subjected to any impact or bending forces which may disrupt the solderable surface.

After the rectifiers are fully formed, each unit is electrically tested. Acceptable units will be marked with device identification and then would be picked and placed into the carrier tape and sealed with cover tape, ready for shipping.

The above process utilizes component parts and materials that are currently used for making axially leaded rectifiers. Accordingly, the process of the present invention can be performed by extending or adding an additional processing branch to the conventional manufacturing line, such that the subassemblies can be used to make either axial leaded or surface mountable rectifiers on a single extended manufacturing line. The construction of the rectifier subassembly employs high temperature brazing materials which are superior to conventional low temperature soldering used in surface mountable products because this material permits exposure to glass firing and epoxy curing temperatures without degradation. Further, devices formed according to the present invention are hermetically sealed with glass prior to molding and hence suitable for military application.

While only a single preferred embodiment of the present invention has been disclosed herein for purposes of illustration, it is obvious that many variations and modifications could be made thereto, it is intended to cover all of these variations and modifications which fall within the scope of the present invention, as defined by following claims.

We claim:

1. A rectifier suitable for surface mounting comprising semiconductor diode, electrodes and leads bonded together, said leads having enlarged head portions with elongated lead portions, said elongated lead portions extending substantially axially in substantially opposite directions a glass capsule substantially surrounding said diode and electrodes with said enlarged head portions substantially exposed, the exposed elongated lead portions having flattened sections, a heat conductive, electrically insulating epoxy body surrounding said capsule, said enlarged head portions and at least a portion of each of said flattened sections, said flattened sections having a bend therein and a solderable coating on a said flattened sections proximate said bend.

2. The device of claim 1 wherein said electrodes comprise molybdenum slugs.

3. The device of claim 2 wherein said leads are bonded to the exterior surfaces of said slugs.

4. The device of claim 1 wherein each of said enlarged portions is adjacent the surface of one of said slugs.

5. The device of claim 1 wherein said flattened sections are proximate to said enlarged lead portions.

6. The device of claim 1 wherein said body comprises a substantially planar surface substantially parallel with said flattened lead sections.

7. The device of claim 1 wherein said coating comprises tin.

8. The device of claim 1 wherein said coating comprises a tin and lead alloy.

9. A method of fabricating a surface mountable rectifier comprising the steps of: forming a subassembly by joining electrodes to the opposite surfaces of a semiconductor diode and joining the enlarged head portions of leads to the non-attached ends of the electrodes, such that elongated portions of the leads extend substantially axially, in substantially opposite directions, encapsulating the subassembly in glass with the enlarged head portions of the leads substantially exposed, flattening sections of the elongated lead portions, forming an electrically insulating, heat conductive epoxy body around the encapsulated subassembly, including the exposed head portions of the leads and at least a portion of each of the flattened lead sections, shaping the exposed flattened lead sections, and after shaping, plating the shaped leads to form a solderable coating thereon.

10. The method of claim 9 wherein the subassembly components are joined by a high temperature brazing process.

11. The method of claim 9 wherein the step of plating comprises the step of barrel plating.

12. The method of claim 9 wherein the step of plating comprises the step of plating the surface with tin.

13. The method of claim 9 wherein the step of plating comprises the step of plating the surface with a tin and lead alloy.

* * * * *